United States Patent [19]

Tsujimoto

[11] Patent Number: 5,293,341
[45] Date of Patent: Mar. 8, 1994

[54] SEMICONDUCTOR MEMORY HAVING A TEST FUNCTION

[75] Inventor: Akira Tsujimoto, Tokyo, Japan

[73] Assignee: NEC Corporation, Tokyo, Japan

[21] Appl. No.: 85,036

[22] Filed: Jul. 2, 1993

[30] Foreign Application Priority Data

Jul. 2, 1992 [JP] Japan .................. 4-175114

[51] Int. Cl.[5] .................. G11C 11/40; G11C 13/00
[52] U.S. Cl. .................. 365/201; 365/189.01; 365/230.01; 371/10.1
[58] Field of Search .......... 365/201, 189.01, 230.01, 365/230.03, 10.1; 371/13, 21

[56] References Cited

U.S. PATENT DOCUMENTS 5,243,570 9/1993 Saruwatari .................. 365/201

OTHER PUBLICATIONS

English Abstracts of the Japanese Provisional Publication No.1 62-250593 (1987).

English Abstracts of the Japanese Provisional Publication No. 63-266695 (1988).

*Primary Examiner*—Terrell W. Fears
*Attorney, Agent, or Firm*—Sughrue, Mion, Zinn, Macpeak & Seas

[57] ABSTRACT

A first test mode signal generating circuit detects, at a timing at which a row address strobe signal changes from an inactive level, to an active level that a column address strobe signal and a write control signal are at an active level to generate an active first test mode signal. A control signal generating circuit detects, during a period in which the row address strobe signal is at the active level, that the column address strobe signal changes from an active level, through an inactive level, and to the active level again to generate an active control signal. A second test mode signal generating circuit generates an active second test mode signal when the first test mode signal and the control signal are at the active level. The first test circuit tests a memory circuit in response to output of the active first test mode signal, and a second test circuit tests the memory circuit in response to output of the active second test mode signal.

4 Claims, 8 Drawing Sheets

SEMICONDUCTOR MEMORY HAVING A TEST FUNCTION

BACKGROUND OF THE INVENTION

1. Field of the Invention

The present invention relates to a semiconductor memory, and more particularly to a semiconductor memory having a test mode signal generating circuit for setting a test mode.

2. Prior Art

As a result of continuous development, the capacity of semiconductor memories has steadily increased. However, the greater the memory capacity, the longer the test time. To overcome this drawback, a DRAM having a memory capacity of 1M bits or more has been developed which incorporates a parallel test function in order to reduce the test time.

FIG. 1 shows an example of a test mode signal generating circuit for a test mode entry (test mode setting).

The test mode signal generating circuit includes a first test mode signal generating circuit 1, a second test mode signal generating circuit 2b, and a reset signal generating circuit 5. The first test mode signal generating circuit 1 is provided with a logic gate G1, an inverter IV1, and a flip-flop FF1.

An operation of the test mode signal generating circuit shown in FIG. 1 will now be described, with reference to FIGS. 2A through 2F.

The inverter IV1 inverts a row address strobe signal RASb (active low) shown in FIG. 2A and supplies it to clock input terminals of flip-flops FF1 and FF2. A gate G1 supplies a high level signal to a D-input terminal of the first flip-flop FF1 when a column address strobe signal CASb (active low) shown in FIG. 2B and a write enable signal WEb (active low) shown in FIG. 2C are both at low level.

If the column address strobe signal CASb shown in FIG. 2B and the write enable signal WEb shown in FIG. 2C are both at low level when the row address strobe signal RASb changes from high level to low level, the flip-flop FF1 sets a first test mode signal TSTa shown in FIG. 2E at high level (active high) indicating a test mode.

When a one-bit (Aj) input terminal TAj of an address signal receives a voltage (a voltage higher than a power supply voltage Vcc, for example) higher than a normal operation voltage as shown in FIG. 2E, a voltage detecting circuit 22 supplies a high-level signal VD to a D-input terminal of the second flip-flop FF2. Accordingly, when the row address strobe signal RASb changes from high level to low level and when a high voltage is applied to the input terminal TAj, the second flip-flop FF2 latches a high-level signal and sets its Q output at a high level.

A gate G2 generates an active (high level) test mode signal TSTb shown in FIG. 2F, when the Q output of the flip-flop FF2 and the first test mode signal TSTa are both at high level.

A reset signal generating circuit 5 generates a reset signal RST when the row address strobe signal RASb and the column address strobe signal CASb satisfy a predetermined level relation, i.e., when both signals are at high level. The flip-flops FF1 and FF2 are reset by the reset signal RST, and the first and second test mode signals TSTa and TSTb assume an inactive level.

A timing for generating the first test mode signal TSTa is opened to a public, or users, as JFDEC standard. More specifically, the timing is determined by WCBR (write CAS before RAS). Accordingly, a user can arbitrarily set the test circuit in the test mode by using the first test mode signal to test the semiconductor memory.

A second test mode is not available to a user, but is reserved by the manufacturer and used to check an operation and the like of the semiconductor memory before shipping.

The high-voltage detecting circuit 22 is provided with cascade-connected diodes D1 through Dm, a transistor Q1, and inverters IV4a and IV5, as shown in FIG. 3, for example. Let it now be assumed that a threshold voltage of the inverter IV4 is V1 and a forward voltage of each of the diodes D1 through Dm is V2. When a voltage higher than $(V1+m \cdot V2)$ is applied to the input terminal TAj, an output signal VD of the inverter IV5 assumes a high level. Assuming that $m=7$, $V1=3$ V, and $V2=1$ V, then the voltage to be applied to the input terminal TAj is higher than 10 V.

As described above, in a conventional semiconductor memory, a voltage higher than a normal operation voltage is applied to the input terminal TAj to thereby make the second test mode signal TSTb active. A level detected by the high-voltage detecting circuit 22 changes as a result of a change in the threshold level and the like, due to variations in the process of manufacturing the transistor Q1, and the diodes D1 through Dm and the inverter IV4. For this reason, there is a possibility that the second test mode signal TSTb cannot be reliably set at the active level.

If the voltage to be applied to the input terminal TAj is increased in order to overcome this problem, it is possible that an excessively high voltage may be applied to the circuit elements connected to the input terminal TAj, thereby resulting reducing the in reliability of the memory device.

SUMMARY OF THE INVENTION

The present invention has been developed in light of the above drawbacks and its object is to provide a semiconductor memory and a test mode signal generating circuit which can reliably set the test mode signal the active level without being affected by fluctuations in the parameters due to variations in the manufacturing process and without reducing the reliability of the memory.

In order to achieve the above object, a semiconductor memory device according to the present invention comprises: a first test mode signal generating circuit for receiving a row address strobe signal, a column address strobe signal, and a write control signal, and for detecting, at a timing at which hen the row address strobe signal changes from an inactive level to an active level, that the column address strobe signal and the write control signal are at an active level to output an active first test mode signal; a control signal generating circuit for receiving the row address strobe signal and the column address strobe signal, and for detecting, during a period in which the row address strobe signal is at the active level, that the column address strobe signal changes from the active level, through the inactive level, and then the active level again to generate the active control signal; a memory circuit for storing data; a first test circuit, coupled to the first test mode signal generating circuit and the memory circuit, for testing the memory circuit in response to output of the active first test mode signal; and a second test circuit, coupled to the second test mode signal generating circuit and the memory circuit, for testing the memory circuit in response to output of the active second test mode signal.

By virtue of the above construction, according to a semiconductor memory of the present invention, the second test mode signal generating circuit detects, during an active period of the row address strobe signal, that the column address strobe signal changes from an active level, through an inactive level and to the active level again, to thereby make the second test mode signal active. Accordingly, a voltage higher than a normal operation voltage does not have to be applied to pads or terminals of the semiconductor memory and thus lowering of the reliability of the memory can be prevented. Further, the effects of fluctuations in the parameters of the circuit elements due to variations in the manufacturing process can be eliminated, as a result of which the second test mode signal can be activated reliably.

DETAILED DESCRIPTION OF THE PREFERRED EMBODIMENTS

Embodiments of the present invention will now be described, with reference to the drawings.

Figure 1:
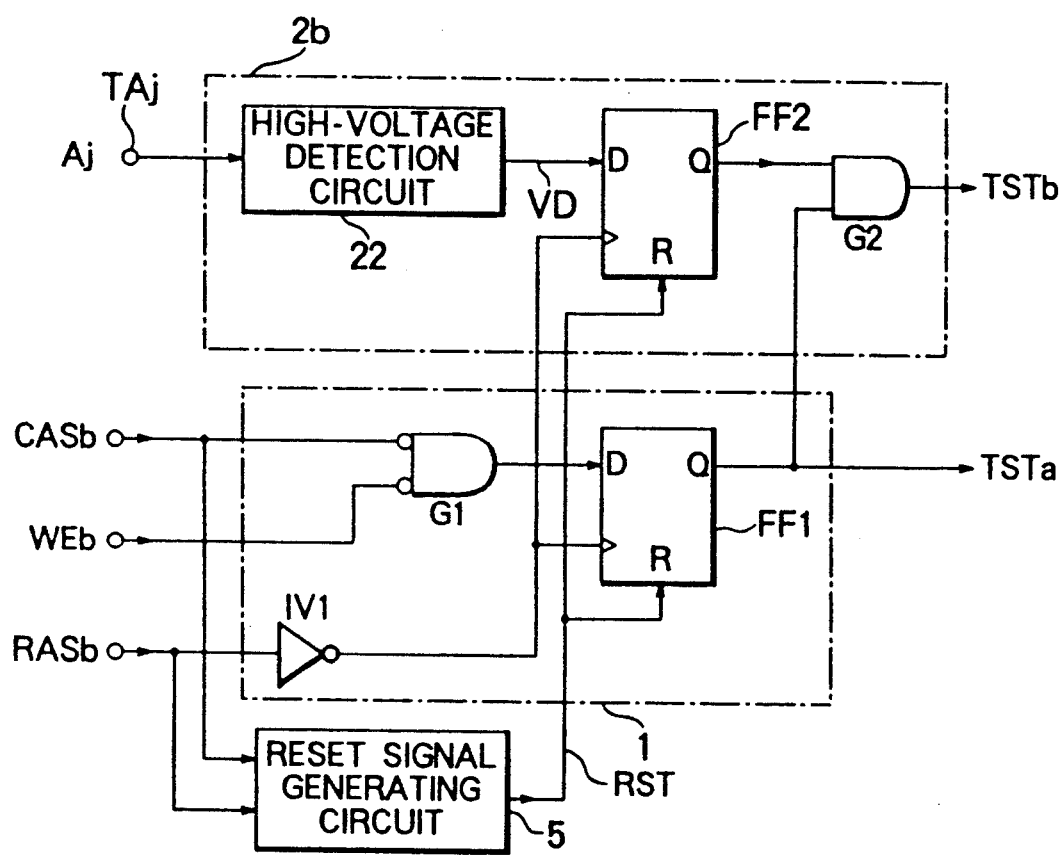
FIG. 1 is a circuit block diagram showing a conventional test mode signal generating circuit used in a semiconductor memory device.
Figure 2:
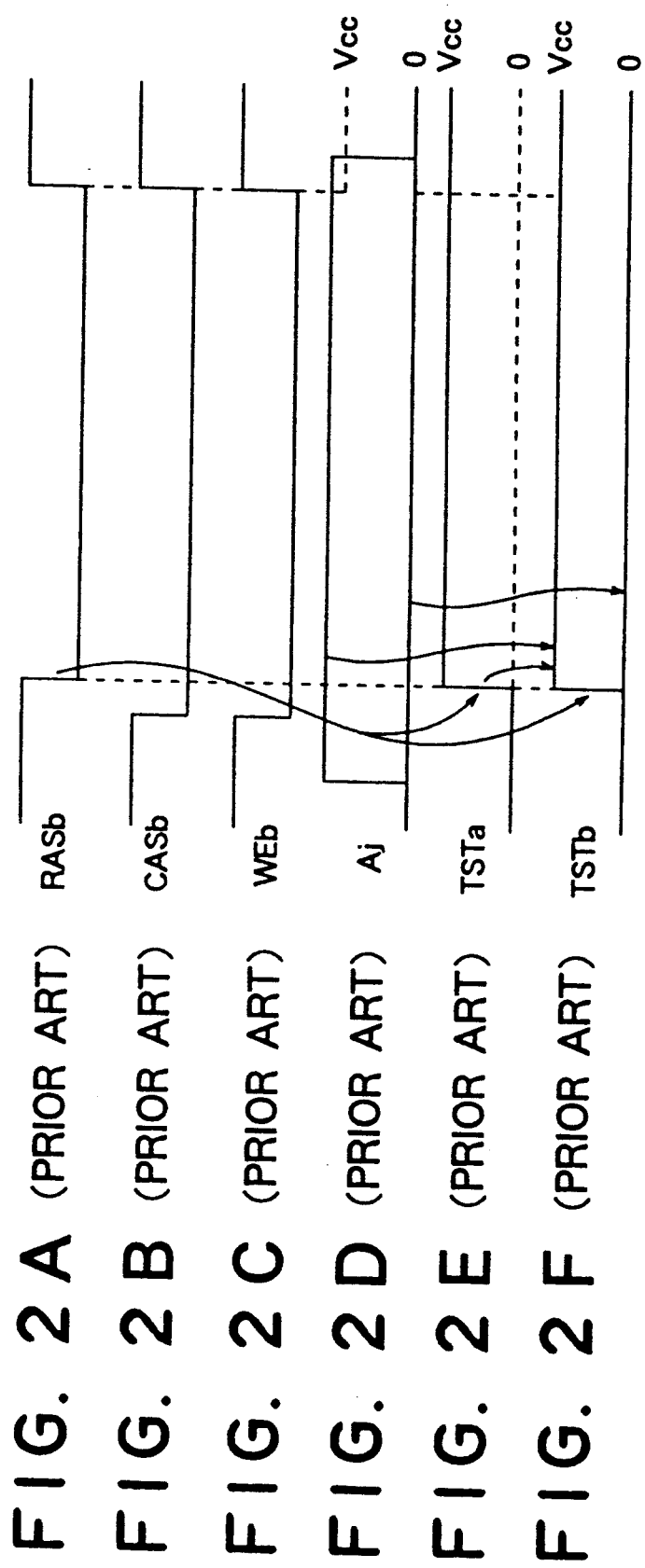
FIGS. 2A through 2F are waveforms depicting an operation performed by the test mode signal generating circuit shown in FIG. 1.
Figure 3:
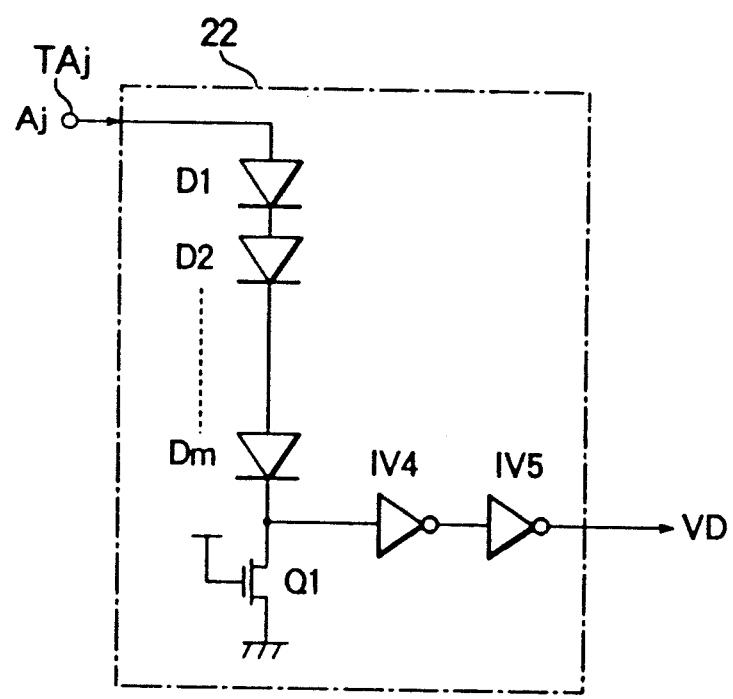
FIG. 3 is a circuit diagram showing an arrangement of a voltage detecting circuit shown in FIG. 1.
Figure 4:
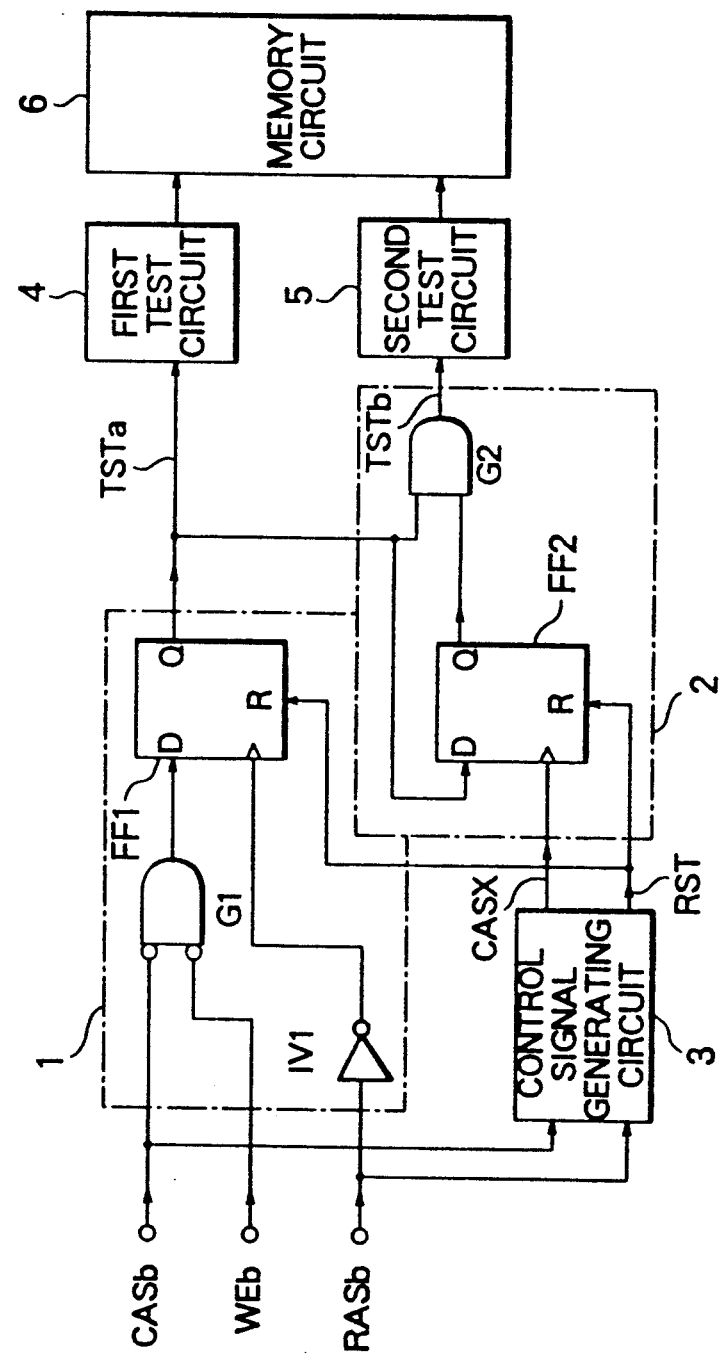
FIG. 4 is a circuit block diagram showing an arrangement of a semiconductor memory including a test mode signal generating circuit according to a first embodiment of the present invention.

FIG. 4 shows an arrangement of a semiconductor memory according to a first embodiment of the present invention. The semiconductor memory shown in FIG. 4 comprises a first test mode signal generating circuit 1, a second test mode signal generating circuit 2, a control signal generating circuit 3, a first test circuit 4, a second test circuit 5, and a memory circuit 6.

The first test mode signal generating circuit 1 generates a first test mode signal TSTa when the row address strobe signal RASb assumes a low level under the condition where both the column address strobe signal CASb and the write enable signal WEb are at low level.

During a period in which the row address strobe signal RASb is at a low level (an active level) the control signal generating circuit 3 detects, that column address strobe signal CASb has assumed an active (low) level to generate a control signal CASX of an active (high) level. Further, the control signal generating circuit 3 generates a reset signal RST when both the row address strobe signal RASb and the column address strobe signal CASb satisfy a predetermined level relation, for example, when both the signals become a high level.

The second test mode signal generating circuit 2 comprises a first flip-flop FF2 which receives at its clock terminal and D-input terminal the control signal CASX supplied from the control signal generating circuit 3 and the first test mode signal TSTa, respectively, and an AND gate G2 for ANDing the test mode signal TSTa and the Q output of the flip-flop FF2.

The first test circuit 4 is activated when the test mode signal TSTa assumes the active level to test a memory circuit 6. The first test circuit 4 can be of a known arrangement and determine whether or not the memory circuit 6 stores and reproduces data reliably by writing predetermined data in memory cells within the memory circuit 6 and then reading the data therefrom.

The second test circuit 5 is activated in response to output of the active test mode signal TSTb and being testing the memory circuit 6. The second test circuit 5 is of a known arrangement.

The memory circuit 6 also if of a known arrangement, such as a memory cell array, a row decoder, a column decoder, a sense amplifier and the like, for storing and reproducing data. The memory circuit 6 is tested by the test circuits 4 and 5.

An operation performed by the semiconductor memory according to a first embodiment will now be described, with reference to FIGS. 5A through 5F.

Figure 5:
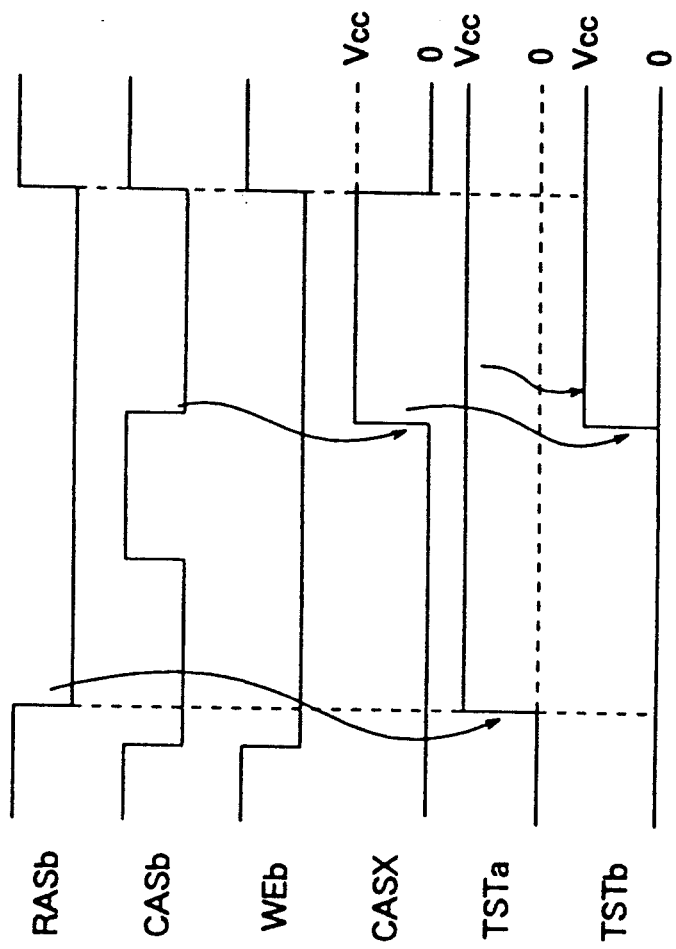
FIGS. 5A through 5F are waveforms depicting an operation performed by the test mode signal generating circuit shown in FIG. 4.

When the semiconductor memory is to be tested by the first test circuit 4, both the column address strobe signal CASb shown in FIG. 5B and the write enable signal WEb shown in FIG. 5C are set at low level. Thereafter, the row address strobe signal RASb shown in FIG. 5A is set at low level. As a result, the test mode signal generating circuit 1 outputs the test mode signal TSTa, shown in FIG. 5E, to activate the first test circuit 4. Thus, the first test circuit 4 tests the memory circuit 6.

On the other hand, when the semiconductor memory to be tested by the second test circuit 5, the column address strobe signal CASb shown in FIG. 5B is set at high level and then set at low level during a period in which the first test mode signal TSTa, shown in FIG. 5E, is at a high (active) level. In other words, the column address strobe signal CASb is first set at high level and then set at low level while the row address strobe signal RASb is kept at low level.

The control signal generating circuit 3 detects that the column address strobe signal CASb changes from high (inactive) level to low (active) level while the row address strobe signal RASb is kept at a low level, and outputs the control signal CASX of a high level shown in FIG. 5D.

In response to the control signal CASX the flip-flop FF2 latches, a high-level signal output from the first test mode signal generating circuit—i.e., the test mode signal TSTa shown in FIG. 5E—and sets the Q output at high level. The AND gate G2 ANDs the high-level test mode signal TSTa and the Q output of the flip-flop FF2 to output a high-level test mode signal TSTb as shown in FIG. 5F. As a result, the test mode signal generating circuit 2 outputs the test mode signal TSTb to activate the second test circuit 5. Thus, the second test circuit 5 tests the memory circuit 6.

By virtue of the above arrangement, the test mode can be set without a voltage higher than a normal operation voltage having to be applied to the semiconductor memory. Accordingly, the reliability of the circuit is not reduced. Further, the memory semiconductor is not affected by fluctuations in the parameters of the circuit elements due to variations in the manufacturing process and the like. Accordingly, the second test mode signal TSTb can be reliably set at an active level.

Figure 6:
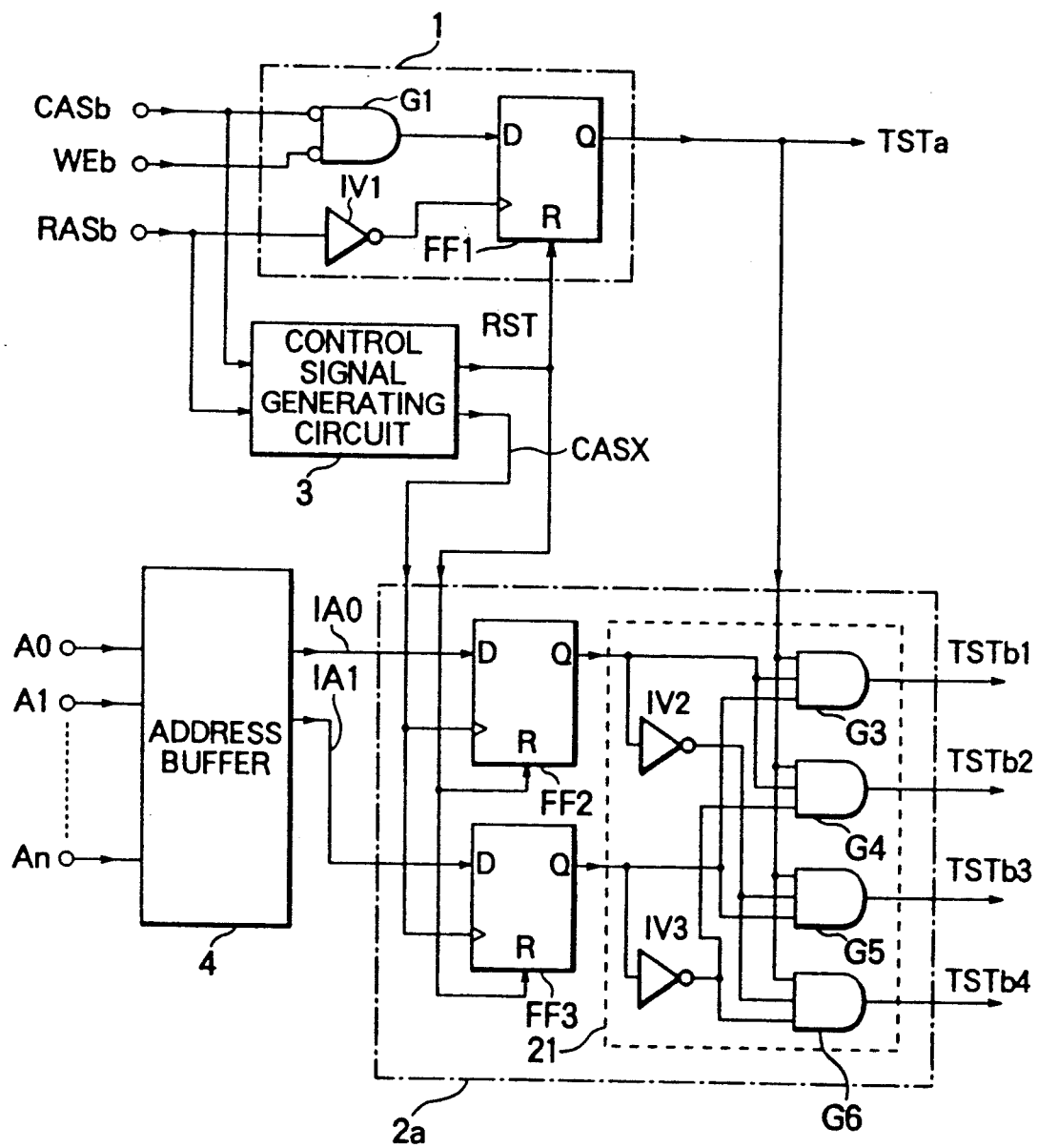
FIG. 6 is a circuit block diagram showing an arrangement of the test mode signal generating circuit according to a second embodiment of the present invention.

A semiconductor memory according to a second embodiment of the present invention will now be described, with reference to FIG. 6.

It should be noted that the arrangement and the operation of the first test mode signal generating circuit 1 are the same as in the first embodiment, and thus description thereof will not be repeated.

A test mode generating circuit 2a according to the second embodiment is characterized by having a function whereby a plurality of second test mode signals TSTb1 through TSTb4 are generated and one of the test mode signals is set at an active level in response to address signals A0 and A1.

The test mode generating circuit 2a includes flip-flops FF2 and FF3 and a decoder 21.

The control signal CASX output from the control signal generating circuit 3 is supplied to the clock terminals of the flip-flops FF2 and FF3.

Address signals A0–An of n bits are supplied to the address buffer circuit 4, and the addresses A0 and A1 are output as signals IA0 and IA1, respectively.

The Q outputs of the flip-flops FF2 and FF3 are supplied to the decoder circuit 21. The decoder circuit 21 comprises inverters IV2 and IV3, and three-input AND gates G3 through G6. The inverter IV2 inverts the Q output of the flip-flop FF2, and the inverter IV3 inverts the Q output of the flip-flop FF3.

The AND gate G3 ANDs the first test mode signal TSTa and the Q outputs of the flip-flops FF2 and FF3 to output the second test mode signal TSTb1. The AND gate G4 ANDs the first test mode signal TSTa, the Q output of the flip-flop FF2, and the output of the inverter IV3 to output the second test mode signal TSTb2. The AND gate G5 ANDs the first test mode signal TSTa, the Q output of the flip-flop FF3 and the output of the inverter IV2 to output the second test mode signal TSTb3. The AND gate G6 ANDs the first test mode signal TSTa and the outputs of the inverters IV2 and IV3 to output the second test mode signal TSTb4.

An operation performed by the test mode generating circuit shown in FIG. 6 will now be described, with reference to FIGS. 7A to 7G. As can be understood from FIGS. 7A, 7B, 7C and 7F, when the row address strobe signal RASb assumes a low level while the column address strobe signal CASb and the write enable signal WEb are kept at a low level, the first test mode signal TSTa changes to a high (active) level.

Figure 7:
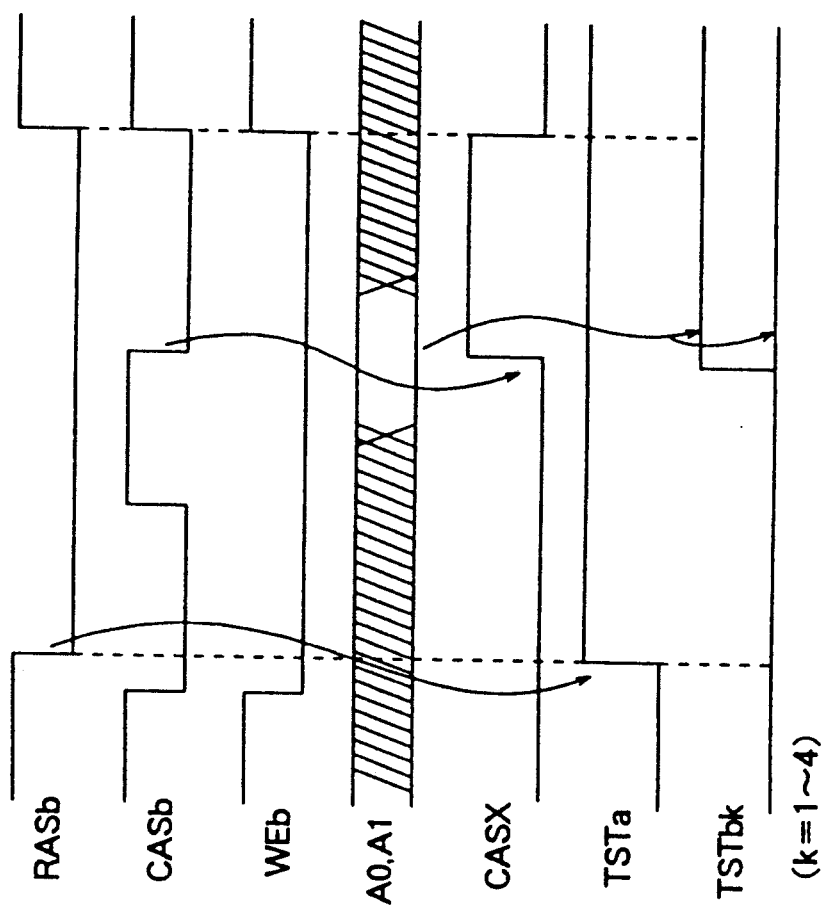
FIGS. 7A through 7G are waveforms depicting an operation performed by the test mode signal generating circuit shown in FIG. 6.

On the other hand, when the column address strobe signal CASb first assumes a high level and then a low level as shown in FIG. 7B, the second test mode signal TSTbK (K=1, 2, 3, 4) shown in FIG. 7G changes to a high (active) level in response to the address signals A0 and A1 shown in FIG. 7D.

For example, when the addresses A0 and A1 are both at high level, the signals IA0 and IA1 assume a high level. The flip-flops FF2 and FF3 latch high level signals in response to the control signal CASX, shown in FIG. 7E, supplied from the control signal generating circuit 3, and as a result, the Q outputs thereof assume a high level. Consequently, the output of the AND gate G3—i.e., the test mode signal TSTb1—assumes a high level.

When the address A0 is at high level and the address A1 is at low level, the signals IA0 and IA1 assume high and low levels, respectively. In response to the control signal CASX shown in FIG. 7E, the flip-flops FF2 and FF3 latch high and low level signals and the Q outputs thereof assume high and low level signals, respectively. Consequently, the output of the AND gate G4—i.e., the test mode signal TSTb2—assumes a high level.

When the addresses A0 and A1 are at low and high levels, the signals IA0 and IA1 assume low and high levels, respectively. In response to the control signal CASX shown in FIG. 7E, the flip-flops FF2 and FF3 latch low and high level signals and the Q outputs thereof assume low and high levels, respectively. Consequently, the output of the AND gate G5—i.e., the test mode signal TSTb3—assumes a high level.

When the addresses A0 and A1 are both at a low level, the signals IA0 and IA1 assume a low level. In response to the control signal CASX shown in FIG. 7E, the flip-flops FF2 and FF3 latch low level signals, and the Q outputs thereof assume a low level. Consequently, the output of the AND gate G6—i.e., the test mode signal TSTb4—becomes a high level.

As described above, an arbitrary test mode signal among the four test mode signals TSTb1 through TSTb4 can be set at an active level and thus a test circuit can be arbitrarily set at an active level by setting the two bits A0 and A1 of the address signal. Accordingly, the number of second test modes can be increased and performed selectively.

An example of the arrangement of the control signal generating circuit 3 used in the first and second embodiments will now be described, with reference to FIG. 8.

The column address strobe signal CASb is supplied to a D-input terminal of a flip-flop 33 and a trigger terminal of a flip-flop 35 through an inverter 31.

Figure 8:
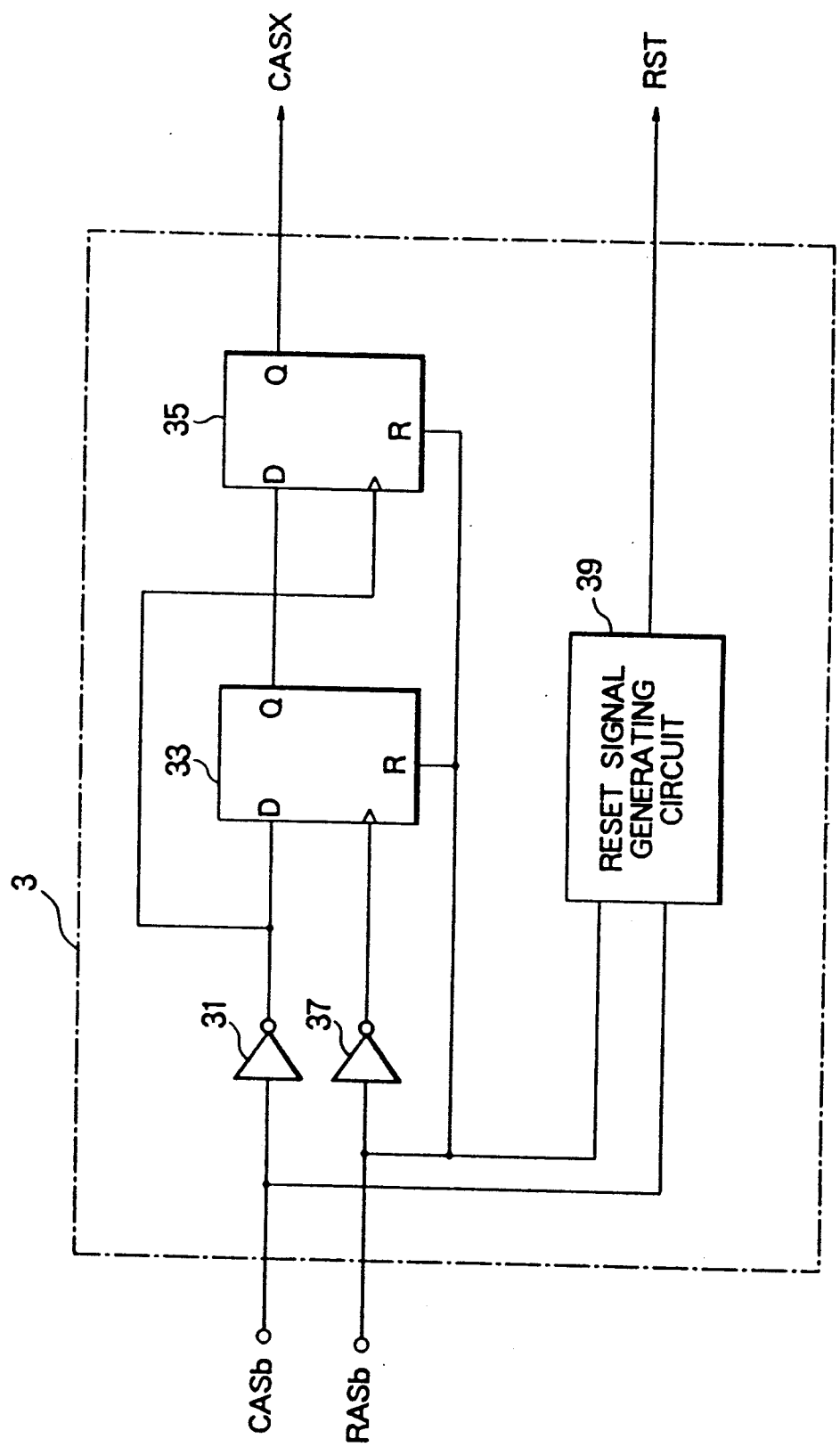
FIG. 8 is a block diagram showing an example of an arrangement of a control signal generating circuit shown in FIGS. 4 and 6.

As shown in FIG. 8, the row address strobe signal RASb is supplied to a reset terminal R of the flip-flop 33, as well as to a trigger terminal thereof, through an inverter 37. Further, the Q output of the flip-flop 33 is supplied to the D-input terminal of the flip-flop 35. The Q output of the flip-flop 35 serves as the control signal CASX.

A reset signal generating circuit 39 having the same arrangement as a conventional reset signal generating circuit outputs a reset signal RST when both the column address strobe signal CASb and the row address strobe signal RASb satisfy a predetermined level relation.

In the above-described embodiments, the control signal generating circuit 3 generates the control signal CASX when the column address strobe signal CASb changes from an active level, through an inactive level, and to an active level again, as shown in FIGS. 5B, 5D, 7B, and 7E. However, the present invention is not limited to the above embodiments. For example, the control signal generating circuit 3 may generate the control signal CASX when a change in the signal level occurs a plurality of times, such as two or three times.

As has been described above, the test mode signal generating circuit of the semiconductor memory according to the present invention detects that the column address strobe signal changes from an active level, through an inactive level, and to the active level again during a period in which the row address strobe signal is at an active level, and sets the second test mode signal at the active level. Accordingly, a voltage higher than a normal operation voltage does not have to be applied to the pads and the terminals of the semiconductor memory, and thus a lowering of the reliability of the memory can be prevented. Further, the effects of the fluctuations in the circuit elements due to variations in the manufacturing process can be eliminated, and thus the second test mode signal can be reliably set at an active level.

What is claimed is:

1. A semiconductor memory device, comprising:

a first test mode signal generating circuit for receiving a row address strobe signal, a column address strobe signal, and a write control signal, and for detecting, at a timing at which the row address strobe signal changes from an inactive level to an active level, that the column address strobe signal and the write control signal are at an active level to output an active first test mode signal;

a control signal generating circuit for receiving the row address strobe signal and the column address strobe signal, and for detecting, during a period in which the row address strobe signal is at the active level, that the column address strobe signal changes from the active level, through the inactive level, and then the active level again to generate the active control signal;

a memory circuit for storing data;

a first test circuit, coupled to the first test mode signal generating circuit and the memory circuit, for testing the memory circuit in response to output of the active first test mode signal; and a second test circuit, coupled to the second test mode signal generating circuit and the memory circuit, for testing the memory circuit in response to output of the active second test mode signal.

2. The semiconductor memory device according to claim 1, further comprising:

a third test mode signal generating circuit for receiving the first test mode signal and the control signal, and for generating an active second test mode signal when the first test mode signal and the control signal are at an active level;

a third test circuit coupled to the third test mode signal generating circuit and the memory circuit, for testing the memory circuit in response to output of the active third test mode signal; and selecting means coupled to the second and third test mode signal generating circuits for receiving a select signal and for controlling outputs of the second and third test mode signal generating circuit in response to output of the select signal.

3. The semiconductor memory device according to claim 1, wherein the second test mode signal generating circuit receives the select signal to generate a plurality of second test mode signals;

and further comprising:

selecting means for activating one of the plurality of second test mode signals in response to output of the select signal when the first test mode signal and the control signal are at an active level; and test circuits provided in one-to-one correspondence with the plurality of second test mode signals.

4. A test mode signal generating circuit for a semiconductor memory device, comprising:

a first test mode signal generating circuit for detecting, at a timing at which a row address strobe signal changes from an inactive level to an active level, that a column address strobe signal and a write control signal are at an active level to generate an active first test mode signal;

a control signal generating circuit for detecting, during a period in which the row address strobe signal is at the active level, that the column address strobe signal changes from an active level, through an inactive level, and then to the active level again, to generate an active control signal; and a second test mode signal generating circuit for generating an active second test mode signal when the first test mode signal and the control signal are at a high level.

* * * * *